(12) United States Patent
Hanhikorpi

(10) Patent No.: US 6,951,621 B2
(45) Date of Patent: Oct. 4, 2005

(54) METHOD FOR FORMING A PRODUCT SENSOR, AND A PRODUCT SENSOR

(75) Inventor: Marko Hanhikorpi, Pirkkala (FI)

(73) Assignee: Rafsec Oy, Tampere (FI)

( * ) Notice: Subject to any disclaimer, the term of this patent is extended or adjusted under 35 U.S.C. 154(b) by 144 days.

(21) Appl. No.: 10/247,754

(22) Filed: Sep. 19, 2002

(65) Prior Publication Data

US 2003/0052077 A1 Mar. 20, 2003

Related U.S. Application Data

(63) Continuation of application No. PCT/FI01/00133, filed on Feb. 13, 2001.

(30) Foreign Application Priority Data

Mar. 31, 2000 (FI) .............................................. 20000755

(51) Int. Cl.$^7$ ............................................... H01B 13/00
(52) U.S. Cl. ............................. 216/13; 216/41; 29/846; 257/386
(58) Field of Search ..................... 216/13, 41; 29/846; 257/386

(56) References Cited

U.S. PATENT DOCUMENTS

| | | | |
|---|---|---|---|
| 3,897,964 A | 8/1975 | Oka et al. | |
| 4,021,705 A | 5/1977 | Lichtblau | |
| 4,253,899 A | 3/1981 | Takemoto et al. | |
| 4,303,949 A | 12/1981 | Peronnet | |
| 4,419,413 A | 12/1983 | Ebihara | |
| 4,450,024 A | 5/1984 | Haghiri-Tehrani et al. | |

(Continued)

FOREIGN PATENT DOCUMENTS

| | | |
|---|---|---|
| DE | 195 11 300 A1 | 10/1996 |
| DE | 19530823 | 2/1997 |
| DE | 19634473 | 1/1998 |
| DE | 19733800 | 2/1999 |
| DE | 19737565 | 3/1999 |
| DE | 19758057 | 5/1999 |

(Continued)

*Primary Examiner*—Shamim Ahmed
(74) *Attorney, Agent, or Firm*—Fitch, Even, Tabin & Flannery

(57) ABSTRACT

The invention relates to a method for forming a product sensor, and a product sensor. The product sensor is formed on a substrate and provided with at least one electric circuit comprising at least one capacitor and at least one coil. At least part of the electric circuit is formed by evaporating a first metallization layer at least at the electric circuit in the product sensor.

10 Claims, 3 Drawing Sheets

U.S. PATENT DOCUMENTS

Figure 1:
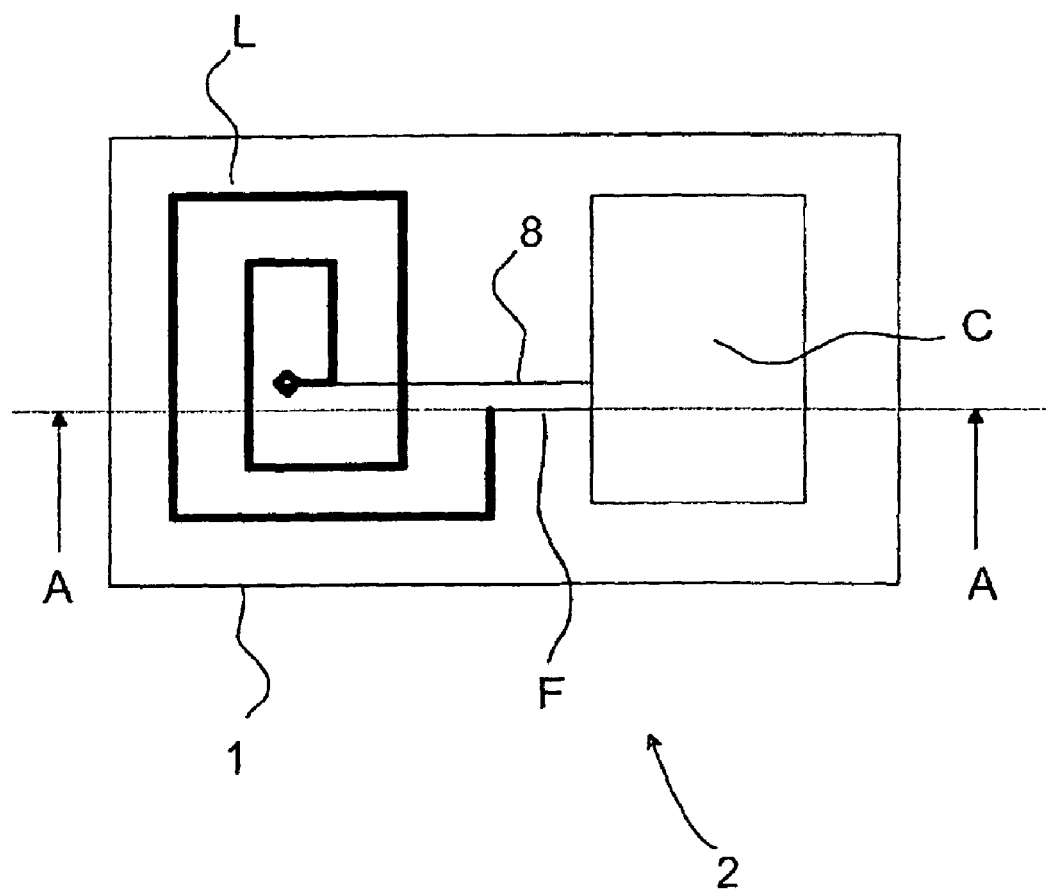

| | | | |
|---|---|---|---|
| 4,455,359 A | | 6/1984 | Patzold et al. |
| 4,686,152 A | | 8/1987 | Matsubayashi et al. |
| 4,846,922 A | | 7/1989 | Benge et al. |
| 4,866,505 A | * | 9/1989 | Roberts et al. ............. 257/782 |
| 4,954,814 A | | 9/1990 | Benge |
| 5,026,452 A | | 6/1991 | Kodai |
| 5,172,461 A | | 12/1992 | Pichl |
| 5,201,976 A | | 4/1993 | Eastin |
| 5,244,836 A | * | 9/1993 | Lim ........................... 438/601 |
| 5,250,341 A | | 10/1993 | Kobayashi et al. |
| 5,266,355 A | | 11/1993 | Wernberg et al. |
| 5,294,290 A | | 3/1994 | Reeb |
| 5,302,431 A | | 4/1994 | Schultz |
| 5,309,326 A | | 5/1994 | Minoru |
| 5,337,063 A | | 8/1994 | Takahira |
| 5,384,955 A | | 1/1995 | Booth et al. |
| 5,525,400 A | | 6/1996 | Manser et al. |
| 5,528,222 A | | 6/1996 | Moskowitz et al. |
| 5,598,032 A | | 1/1997 | Fidalgo |
| 5,689,263 A | | 11/1997 | Dames |
| 5,690,773 A | | 11/1997 | Fidalgo et al. |
| 5,714,305 A | | 2/1998 | Teng et al. |
| 5,781,110 A | | 7/1998 | Habeger, Jr. et al. |
| 5,810,959 A | | 9/1998 | Tanaka et al. |
| 5,822,194 A | | 10/1998 | Horiba et al. |
| 5,837,367 A | | 11/1998 | Ortiz, Jr. et al. |
| 5,850,690 A | | 12/1998 | Launay et al. |
| 5,867,102 A | | 2/1999 | Souder et al. |
| 5,918,113 A | | 6/1999 | Higashi et al. |
| 5,918,363 A | | 7/1999 | George et al. |
| 5,920,290 A | | 7/1999 | McDonough et al. |
| 5,932,301 A | | 8/1999 | Kamiyama et al. |
| 5,935,497 A | | 8/1999 | Rose |
| 5,936,847 A | | 8/1999 | Kazle |
| 5,937,512 A | | 8/1999 | Lake et al. |
| 5,952,713 A | | 9/1999 | Takahira et al. |
| 5,962,840 A | | 10/1999 | Haghiri-Tehrani et al. |
| 5,969,951 A | | 10/1999 | Fischer et al. |
| 5,973,600 A | | 10/1999 | Mosher, Jr. |
| 5,982,284 A | | 11/1999 | Baldwin et al. |
| 5,994,263 A | | 11/1999 | Ohshima et al. |
| 6,025,780 A | | 2/2000 | Bowers et al. |
| 6,040,630 A | | 3/2000 | Panchou et al. |
| 6,066,377 A | | 5/2000 | Tonyali et al. |
| 6,066,378 A | | 5/2000 | Morii et al. |
| 6,077,382 A | | 6/2000 | Watanabe |
| 6,113,728 A | | 9/2000 | Tsukagoshi et al. |
| 6,161,761 A | | 12/2000 | Ghaem et al. |
| 6,206,292 B1 | | 3/2001 | Robertz et al. |
| 6,220,516 B1 | | 4/2001 | Tuttle et al. |
| 6,248,199 B1 | | 6/2001 | Smulson |
| 6,249,199 B1 | | 6/2001 | Liu |
| 6,259,408 B1 | | 7/2001 | Brady et al. |
| 6,288,905 B1 | | 9/2001 | Chung |
| 6,293,470 B1 | | 9/2001 | Asplund |
| 6,315,856 B1 | | 11/2001 | Asagiri et al. |
| 6,325,294 B2 | | 12/2001 | Tuttle et al. |
| 6,330,162 B2 | | 12/2001 | Sakamoto et al. |
| 6,353,420 B1 | | 3/2002 | Chung |
| 6,371,378 B1 | | 4/2002 | Brunet et al. |
| 6,376,769 B1 | | 4/2002 | Chung |
| 6,404,643 B1 | | 6/2002 | Chung |
| 6,412,470 B1 | | 7/2002 | Denz |
| 6,412,702 B1 | | 7/2002 | Ishikawa et al. |
| 6,421,013 B1 | | 7/2002 | Chung |
| 6,478,229 B1 | | 11/2002 | Epstein |
| 6,480,110 B2 | | 11/2002 | Lee et al. |
| 6,522,549 B2 | | 2/2003 | Kano et al. |
| 6,540,865 B1 | | 4/2003 | Miekka et al. |
| 6,557,766 B1 | | 5/2003 | Leighton |
| 6,569,280 B1 | | 5/2003 | Mehta et al. |
| 6,595,426 B1 | | 7/2003 | Brunet et al. |
| 6,736,918 B1 | | 5/2004 | Ichikawa et al. |
| 6,780,668 B1 | | 8/2004 | Tsukahara et al. |
| 6,843,422 B2 | | 1/2005 | Jones et al. |

FOREIGN PATENT DOCUMENTS

| | | |
|---|---|---|
| DE | 19915765 | 10/2000 |
| EP | 0227293 | 7/1987 |
| EP | 0249266 | 12/1987 |
| EP | 0545910 | 6/1993 |
| EP | 0575631 | 12/1993 |
| EP | 0620091 | 10/1994 |
| EP | 0625832 | 11/1994 |
| EP | 0692770 | 1/1996 |
| EP | 0704816 | 4/1996 |
| EP | 0706152 | 4/1996 |
| EP | 0717371 | 6/1996 |
| EP | 0737935 | 10/1996 |
| EP | 0788159 | 8/1997 |
| EP | 0824270 | 2/1998 |
| EP | 0870627 | 10/1998 |
| EP | 0922555 | 6/1999 |
| EP | 0991014 | 4/2000 |
| EP | 1014302 | 6/2000 |
| EP | 0 730 254 B1 | 7/2001 |
| EP | 1130542 | 9/2001 |
| EP | 1132859 | 9/2001 |
| EP | 1172761 | 1/2002 |
| EP | 1225538 | 7/2002 |
| FI | 20001345 | 12/2001 |
| FI | 20002707 | 6/2002 |
| FR | 2744270 | 8/1997 |
| FR | 2780534 | 12/1999 |
| FR | 2782821 | 3/2000 |
| GB | 2279612 | 1/1995 |
| GB | 2294899 | 5/1996 |
| JP | 61268416 | 11/1986 |
| JP | 02141094 | 5/1990 |
| JP | 5-279841 | 10/1993 |
| JP | 09197965 | 7/1997 |
| JP | 11221986 | 8/1999 |
| JP | 2000048153 | 2/2000 |
| JP | 2000057287 | 2/2000 |
| JP | 2000113147 | 4/2000 |
| JP | 2000215288 | 8/2000 |
| JP | 2000235635 | 8/2000 |
| JP | 2000242740 | 9/2000 |
| JP | 2001118040 | 4/2001 |
| JP | 2002140672 | 5/2002 |
| WO | WO 93/01571 | 1/1993 |
| WO | WO 97/14112 | 4/1997 |
| WO | WO 98/44195 | 10/1998 |
| WO | WO 98/49652 | 11/1998 |
| WO | WO 99/08245 | 2/1999 |
| WO | WO 99/24934 | 5/1999 |
| WO | WO 99/40760 | 8/1999 |
| WO | WO 99/48071 | 9/1999 |
| WO | WO 00/45353 | 8/2000 |
| WO | WO 01/16878 | 3/2001 |
| WO | WO 01/85451 | 11/2001 |
| WO | WO 02/49093 | 6/2002 |
| WO | WO 02/082368 | 10/2002 |

* cited by examiner

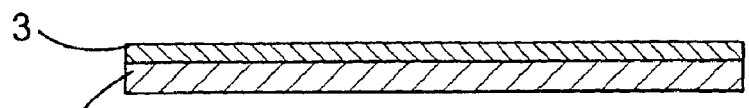
Fig. 2a
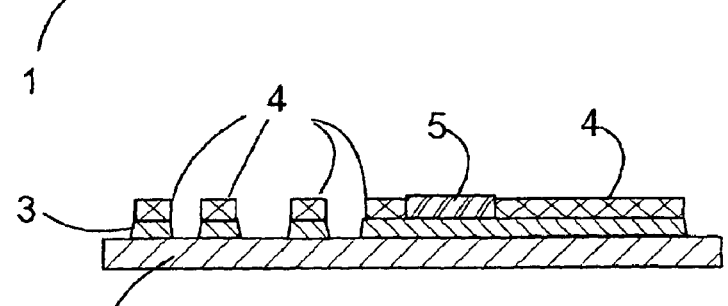
Fig. 2b
Fig. 2c
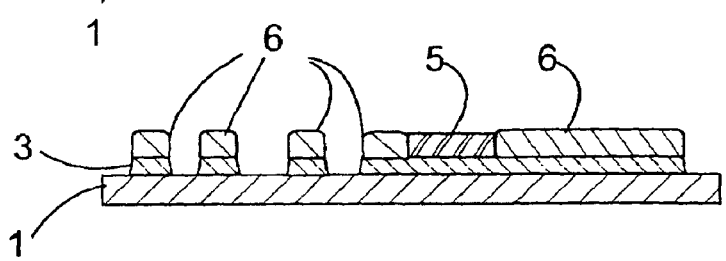
Fig. 2d
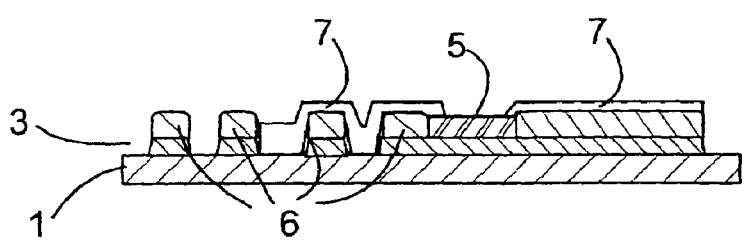
Fig. 2e
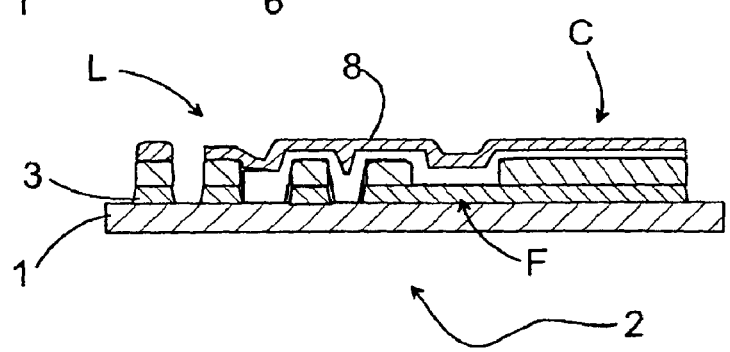

METHOD FOR FORMING A PRODUCT SENSOR, AND A PRODUCT SENSOR

This is a continuation of prior application Ser. No. PCT/FI01/00133, filed Feb. 13. 2001 designating the U.S., which is hereby incorporated herein by reference in its entirety.

The present invention relates to a method for forming a product sensor according to the preamble of the appended claim 1, as well as a product sensor according to the preamble of the appended claim 5.

In this description, a product sensor refers to an electric coupling which is formed in connection with a product or a product package or on a separate substrate and which can be used for identifying the product, for example as a product protection for preventing thefts (anti-theft sensor), or as an identification means for identification of the product/user. Product sensors formed on a separate substrate can be attached to the product preferably by glueing or by sewing, but also other methods can be applied.

Product protection sensors are used in connection with products to prevent possible attempts of stealing the product. Products are thus equipped with a product sensor used as a product protection sensor, and the exits of shops are equipped with detectors by which such a product protection sensor can be detected if it has not been deactivated in the shop. The product protection sensor is deactivated at the stage when the product is duly paid for at a cash desk. As a main rule, such a deactivated product protection sensor is not detected by the detectors, wherein unnecessary alarms are avoided.

These product sensors used as product protection sensors and/or for identification are normally made of a thin plastic film which is coated on both sides by laminating with an aluminium film. A colouring agent is advantageously applied onto the aluminium films by using e.g. the gravure printing technique. The colouring agent is used to produce a desired pattern on the metal film, wherein when the metal is removed e.g. by etching off, a metal pattern is left which forms a desired electric circuit. Such an electric circuit in the product sensor normally consists of a resonance circuit comprising one or more coils and a capacitor. The purpose of the resonance circuit in the product protection sensor is e.g. that the detector can detect the presence of this resonance circuit, if the product protection sensor is not deactivated. In identification applications, the resonance circuit is used e.g. to transfer electric energy to the product sensor as well as to transmit information between the product sensor and a reading and/or writing device for the product sensor.

Deactivation of the product protection sensor can be performed for example by providing the capacitor plates of the product protection sensor with a breakdown which short-circuits the capacitor plates and thereby eliminates the resonance circuit. A problem in such deactivation is for example the fact that the breakdown is not necessarily permanent, wherein the product sensor can be re-activated for example by bending of the product sensor. Another problem with such product sensors to be deactivated with an electric field is that discharges of static electricity typically occur in automatic packaging and labelling lines, which may cause deactivation of the product sensor already at the stage of packaging or labelling.

Also, product sensors are known in which the deactivation is performed by breaking a fuse formed in the resonance circuit. The breaking is implemented in such a way that the product sensor is subjected to an electromagnetic field whose frequency is substantially the resonance frequency, which produces a high current intensity in the resonance circuit. This current passes also through the fuse, and since the fuse is designed to have such a capacity that it will burn off at a certain current intensity, the fuse can normally be broken by means of this electromagnetic field. One problem in such a fuse solution is that in prior art manufacturing methods, the production tolerances of the fuse are relatively large, wherein the current intensity required for breaking the fuse is not necessarily within the allowed limits in different single product sensors. In some product sensors of prior art, this fuse is made with a separate conductor which is connected to conductors formed in a serial resonance circuit. This so-called wire ponding method is expensive and has a small production capacity compared with e.g. product sensors implemented with the above-mentioned etching method, in which the fuse is also made with a corresponding method.

To detect the product sensor in a sufficiently reliable manner in the reading device, the quality value of the resonance circuit must be very high in present product sensors of standard size, for example 40 mm×40 mm. Established practice in the field requires a minimum value of 70 for the quality value Q. However, as the aim in the manufacture of the product sensor is to implement the product sensor in a cost-effective way and with a large volume, in practice, a compromise must be made in the electric properties of the coil conductor. In practice, this means that the conductivity of the conductors in products on the market are similar to that of bulk aluminium or even slightly poorer. With this conductivity, product sensors on the market typically have a Q value in the order of 70 to 80.

However, the operation of the fuse is based on the idea that it is heated and burnt off by the effect of the current in the circuit. Because of this operating mechanism of the fuse, the fuse impairs the Q value of the product sensor. Thus, a fuse cannot be added in a typical product sensor of prior art e.g. by pressing with a conductive paste without reducing the Q value below the acceptable level. On the other hand, in product sensors based on breakdown, the deactivating mechanism does not considerably reduce the Q value, because the deactivation is not based on the use of resistive components.

Yet another electrical technical problem related to product sensors lies in the fact that the difference between the magnetic fields which the product sensors should resist and, on the other hand, in which the product sensor should be deactivated, is very small. Typically, the product sensor should resist a magnetic field in the order of 0.9 A/m and, in a corresponding manner, a magnetic field in the order of 1.5 A/m should be sufficient for deactivation. Consequently, in the design of the fuse, this requires precise control of the resisting properties, low resistivity, and balancing of the total resistance of the oscillating circuit between the different components. The requirement of low resistivity is due to the fact that a larger field must induce a sufficiently higher current intensity that is induced by a smaller field in the circuit.

The manufacture of the product sensor also involves some problems, such as the quantity of material for the fuse. To make the current for inducing a deactivating field sufficient for burning the fuse, the quantity of material in the fuse must be very small compared with for example the quantity of material required for the coil conductor. Furthermore, this quantity of material for the fuse must be very precisely controllable. The smaller the quantity of material used for making the fuse, the smaller its resistance load with respect to the rest of the circuit, and the less the reduction in the Q value caused by the fuse. Furthermore, with more precise controllability of the quantity of material, the current required for burning off the fuse can be predicted better; in other words, the burning of the fuse can be made more reliable. By improving the production tolerance of the fuse, it is possible to slightly increase the manufacturing tolerances of the coil and the capacitor.

Another problem related to the manufacturing technique is the way in which the small quantity of material required in the fuse is placed in the product sensor which is made by machines from one roll to another and on a film in which the dimensional error can easily be in the order of even one percent.

Yet a third problem in the manufacturing techniques relates to the adhesion and contact resistance between two different interfaces. In practice, the only possible materials for the coil conductor are copper and aluminium, because of e.g. the required high Q value. However, copper and aluminium very easily form an inherent oxide layer which unnecessarily increases the resistance value of the fuse without being actually an element to be burnt off.

Yet a fourth problem in the manufacturing technique relates to the mechanical properties of the fuse. As the product sensor is typically flexible and is manufactured from one roll to another, the production material must be flexible. Furthermore, the electrical conductivity properties of this production material must not be significantly changed by the effect of even reasonable bending. Because of the above-mentioned manufacturing and electrotechnical problems, the product sensor cannot be made by using the etching technique only.

Another problem in the manufacture of product sensors according to prior art is that the production of the wirings, particularly the capacitor, solely by evaporating does not guarantee sufficiently good electrical properties. However, if the wiring is formed by a conductive paste, such as a silver paste, the electrical properties can be improved, but the manufacturing costs of such a product sensor are significantly increased.

It is an aim of the present invention to provide a method of manufacturing a product sensor, in which the manufacturing precision of the electric circuit, particularly the fuse, can be improved when compared with fuse solutions of prior art. Furthermore, by means of the manufacturing method of the invention, it is possible to provide a product sensor, in which the electrical properties of the electric circuit, particularly the fuse, are more accurately controlled than in solutions of prior art. The invention is based on the idea that the electric circuit is made by evaporating and by depositing at least some of the components of the electric circuit onto the evaporated conductive layer, preferably by electrolysis. More precisely, the manufacturing method according to the present invention is characterized in what will be presented in the characterizing part of the appended claim 1. Further, the product sensor according to the present invention is characterized in what will be presented in the characterizing part of the appended claim 5.

Considerable advantages are achieved by the present invention when compared with solutions of prior art. By the manufacturing method according to the invention, it is possible to improve the production tolerances of the fuse, wherein the operation of the product sensor according to the invention is more secure particularly in the situation of deactivation, wherein false alarms can be avoided. By means of the manufacturing method according to the invention, product sensors can be made in a cost-effective way and in a large volume.

In the following, the invention will be described in more detail with reference to the appended drawings, in which FIG. 1 shows a top view of a product sensor according to a preferred embodiment of the invention, and FIGS. 2a to 2e show, in a cross-section at line A—A of FIG. 1, different steps in the method according to a preferred embodiment of the invention, FIGS. 3a to 3f show, in a cross-section at line A—A of FIG. 1, different steps in the method according to another preferred embodiment of the invention.

The following is a description on the method according to a preferred embodiment of the invention, wherein a product sensor 2 according to the invention is manufactured on a substrate 1, such as a label laminate. FIG. 1 shows a top view of the product sensor 2 complying with a preferred embodiment of the invention. FIGS. 2a to 2f show, in a cross-section at line A—A of FIG. 1, different steps in the method according to a preferred embodiment of the invention. In this context, it should be mentioned that for clarity, the cross-sections shown in FIGS. 2a to 2f do not necessarily have correct dimensions, and in practical solutions, the thicknesses of the different layers can differ very much from each other. Although in the following description, the manufacturing method of the invention will be described primarily in view of the manufacture of a single product sensor 2, it is obvious that the method of the invention can be used to manufacture several product sensors 2 simultaneously.

The manufacture of product sensors 2 is preferably started by forming a first conductive layer 3 by evaporating on the substrate material 1. The substrate material is preferably flexible, wherein the ready product sensors can be wrapped e.g. on a roll and they can be used in connection with a large variety of products. The substrate material may also comprise an adhesive surface and a film (not shown) which protects the adhesive surface at the manufacturing stage and in possible stages of storage and transportation. In a preferred embodiment of the invention the substrate material is of poly(ethylene terephthalate) and the thickness of the substrate is in the order of 25 to 50 $\mu$m. FIG. 2a shows the final result of the first stage of the manufacturing method of the invention in a reduced cross-section. At this stage, a substantially uniform conductive layer 3 is formed on the surface of the substrate 1. Thus, for example copper or aluminium are used in the evaporation of the first conductive layer 3, and the thickness of evaporation is typically in the order of 50 to 500 nm, preferably in the order of 50 to 200 nm. At the next stage, illustrated by FIG. 2b, a so-called resist is printed onto the first conductive layer 3, for example by gravure printing or flexographic printing. The resist can be so called etching resist or electrolytic resists, depending on the order of later steps of the method according to the invention. The etching resist has such a pattern that it is applied at those points in the ready product sensor 2 which contain a conductive agent, such as a fuse, a coil or a capacitor. Respectively, the electrolytic resist has such a pattern that an electrolytic resist is applied at those points in the ready product sensor 2 which do not contain a conductive agent, such as a fuse, a coil or a capacitor.

Next, in such product sensor applications, in which the product sensor comprises one or more fuses F, a fuse mask is applied on the surface of the first conductive layer 3 of the product sensor 2 at the location in which the fuse F is to be implemented. In some applications, it is also possible to use more than one fuse, wherein a fuse mask is formed in a corresponding manner at the fuses in which these fuses are to be formed. The fuse mask is printed onto the first conductive layer 3 for example by silk screen printing, gravure printing or flexographic printing. The final result of this step is illustrated in a reduced cross-section by the appended FIG. 2c. In this figure, the fuse mask is indicated with the reference 5, and the electrolytic/etching resist with the reference 4.

According to the preferred embodiment of the invention a so called micro etching is performed next. The purpose of the micro etching is to remove the unnecessary parts of the first conductive layer 3 i.e. those parts which are not under the etching resist. The etching layer 4 is removed after the micro etching is performed. The etching resist can be removed for example with lye. The fuse mask 5 is made of such a material which resists to the effect of this substance to remove the electrolytic resist, wherein the part of the first conductive layer 3 at the fuse mask 5 is not dissolved. The use of lye for removing the etching resist is especially advantageous when aluminium has been used at the stage of evaporation, wherein the micro etching is performed simultaneously. However, if copper has been used as the evaporating substance, the removal, or etching, of the evaporated plating at the electrolytic resist can be performed with a separate bath, e.g. sulphuric acid having concentration of about 10%, in a way known as such. FIG. 2b shows the product sensor 2 in a reduced cross-section after this stage of removing the metallization outside the etching resist.

After removing the etching layer 4, the depositing of the conductors can be performed preferably by electrolysis. At this stage, a second conductive layer 6 is formed as a result of the electrolysis at those points on the conductive layer 3 which contain plating, but not on the fuse mask 5. The thickness of the second conductive layer 6 is typically in the order of 25 to 40 $\mu$m. After this, the dielectric layer 7 of the capacitor(s) C is advantageously silk screen printed on the second conductive layer 6. In connection with that, the dielectric layer 7 can be formed on the second conductive layer 6 in such places where a conductor 8 connecting a second electrode of the capacitor C and the inductor L is to be formed. The cross-section of the product sensor 2 after this stage is illustrated in the appended FIG. 2c.

Next, a third conductive layer is advantageously applied for example to provide a second capacitor plate and the other necessary conductors, e.g. said conductor 8, for the electric circuit. The dielectric layer can be formed e.g. by silk screen printing or by another known method. The third conductive layer can also be formed e.g. by silk screen printing in which e.g. silver paste is used for forming the conductors. Nevertheless, it is obvious that this third conductive layer can also be provided with one or more fuses by the above-mentioned method according to an advantageous embodiment of the invention. After the product sensor 2 has been provided with all the necessary layers, the product sensor 2 can still be, if necessary, laminated or coated in another way to be better resistant to ambient conditions.

If necessary, the fuse mask 5 can still be removed from the product sensor 2 in such a way that the rest of the electric couplings of the product sensor 2 are not considerably affected. FIG. 2e shows a product sensor 2 from which also the fuse mask 5 has been removed.

At this stage, the surface of the substrate 1 of the product sensor 2 is provided with an electric circuit which, for example in anti-theft applications, comprises an RLC circuit. The coil L is a planar wire loop, and the capacitor C consists of two or more substantially planar plates, which is known as such.

In another advantageous embodiment of the invention the substrate is of polypropylene and conductive layers are evaporated on both sides of the substrate (not shown). The thickness of the substrate is typically in the order of 30 $\mu$m and the thickness of the conductive layers is typically in the order of 50 to 200 nm. In this method the etching resist is printed on both conductive layers. The fuse mask is then printed at least on the first etching layer, after which the micro etching process is performed on the first conductive layer to remove the unnecessary part of it. Next, the etching layer is removed and necessary conductors are deposited on the first conductive layer.

When the above mentioned procedures are performed on the first side of the substrate, similar procedures can be performed on the second side of the substrate to form necessary electrodes and conductors, e.g. capacitor electrodes. In this embodiment the substrate can be used as the dielectric layer of the capacitors of the product sensor, wherein the printing of the dielectric layer is not necessary.

The product sensor is now provided with an electric circuit which comprises an RLC circuit. It comprises at least two capacitors, wherein it is not necessary to form lead-through holes through the substrate. It is, however, possible to use lead-through hole which can be used to connect electrodes on both sides of the substrate. Such lead-through holes can be formed e.g. by punching preferably after the first side of the substrate is produced. The lead-through holes can be made conductive by e.g. silk screen printing.

In still another advantageous embodiment of the invention, in which the substrate comprises evaporated conductive layers on both sides of the substrate, the first conductive layer is formed as described above, but the second conductive layer is produced by silk screen printing (not shown). If necessary, electrolysis can be applied on the second side after the silk screen printing to strengthen the conductive layer. The product sensor according to this embodiment can also comprise lead-through holes, as is disclosed above.

Next, yet another advantageous embodiment of the invention is described with reference to FIGS. 3a–3e. The steps of the method are quite similar to the method according to the preferred embodiment of the invention. The substrate material can be e.g. poly(ethylene terephthalate) or polypropylene. The conductive layers are evaporated either on one side of the substrate or on both sides of the substrate. The thickness of the substrate is in the order of 25 to 50 $\mu$m. The main differences are that the order of removing the resist 4 and the depositing of the electrodes is reversed, wherein electrolytic resist is removed before the conductors are deposited. The manufacture of product sensors 2 is preferably started by forming a first conductive layer 3 by evaporating on the substrate material 1. The substrate material is preferably flexible, wherein the ready product sensors can be wrapped e.g. on a roll and they can be used in connection with a large variety of products. FIG. 2a shows the final result of the first stage of the manufacturing method of the invention in a reduced cross-section. At this stage, a substantially uniform conductive layer 3 is formed on the surface of the substrate 1. At the next stage, illustrated by FIG. 3b, an electrolytic resist is printed onto the first conductive layer 3, for example by gravure printing or flexographic printing.

Next, a fuse mask is applied on the surface of the first conductive layer 3 of the product sensor 2 at the location in which the fuse F is to be implemented. In some applications, it is also possible to use more than one fuse, wherein a fuse mask is formed in a corresponding manner at the fuses in which these fuses are to be formed. The fuse mask is printed onto the first conductive layer 3 for example by silk screen printing, gravure printing or flexographic printing. The final result of this step is illustrated in a reduced cross-section by the appended FIG. 3c. In this figure, the fuse mask is indicated with the reference 5, and the electrolytic resist with the reference 4.

According to this advantageous embodiment of the invention, electrolysis is used before etching. This means that the electrolytic resist is applied at those points on the substrate, which do not contain a conductive agent, such as a fuse, a coil or a capacitor, in the ready product sensor 2.

The depositing of the conductors can be performed preferably by electrolysis. At this stage, a second conductive layer 6 is formed as a result of the electrolysis at those points on the conductive layer 3 which do not contain the electrolytic resist 4 or the fuse mask 5. The thickness of this second conductive layer 6 is typically in the order of 25 to 40 $\mu$m. After this, the desired conductive pattern is formed onto the first conductive layer 3 of the product sensor, although still short-circuited by the first conductive layer 3 at this stage. The cross-section of the product sensor 2 after this depositing stage is illustrated in the appended FIG. 3d.

Figure 3A:
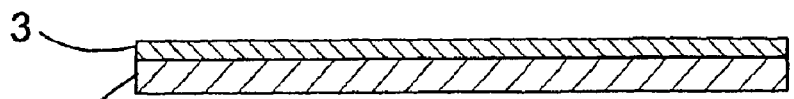
Figure 3B:
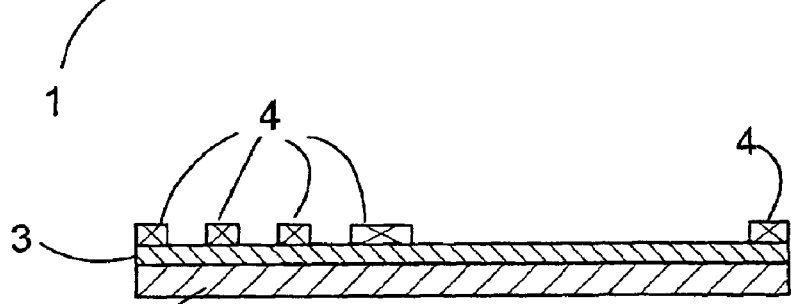
Figure 3C:
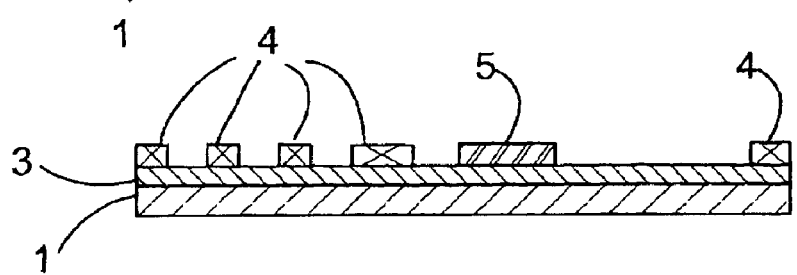
Figure 3D:
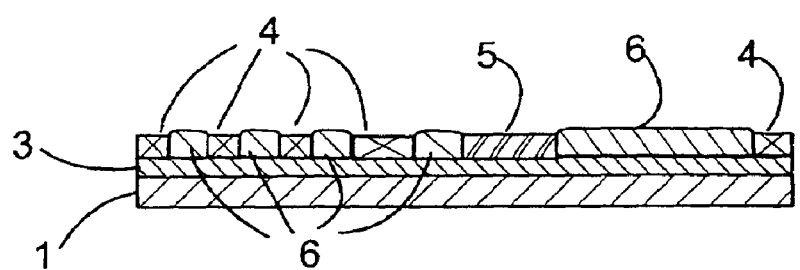
Figure 3E:
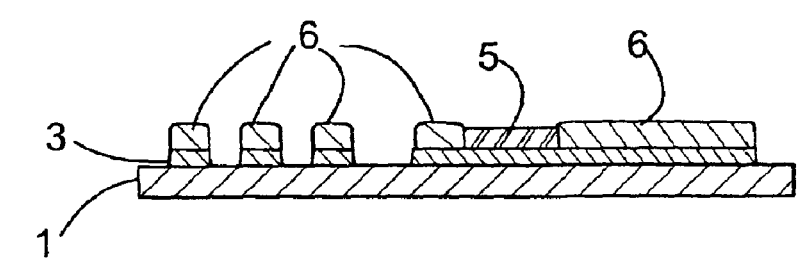

After the depositing stage, the electrolytic resist 4 and the unnecessary part of the first conductive layer which is under the electrolytic resist must still be removed. The electrolytic resist can be removed for example with lye. The fuse mask 5 is made of such a material which resists to the effect of this substance to remove the electrolytic resist, wherein the part of the first conductive layer 3 at the fuse mask 5 is not dissolved. The use of lye for removing the electrolytic resist is especially advantageous when aluminium has been used at the stage of evaporation. However, if copper has been used as the evaporating substance, the removal, or etching, of the evaporated plating at the electrolytic resist can be performed with a separate bath, e.g. sulphuric acid having concentration of about 10%, in a way known as such. FIG. 3e shows the product sensor 2 in a reduced cross-section after this stage of removing the electrolytic resist and the metallization.

Figure 3F:
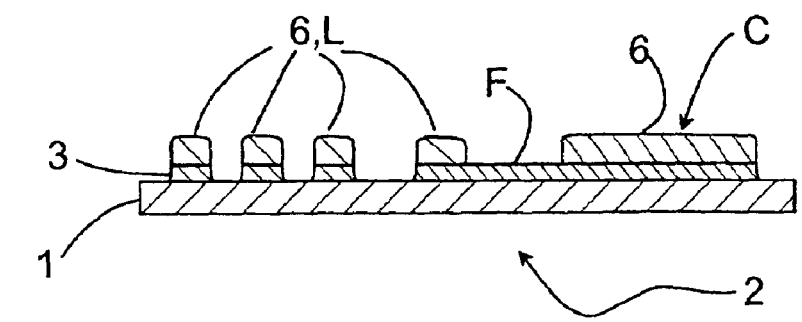

If necessary, the fuse mask 5 can still be removed from the product sensor 2 in such a way that the rest of the electric couplings of the product sensor 2 are not considerably affected. FIG. 3f shows a product sensor 2 from which also the fuse mask 5 has been removed.

Next, a dielectric layer and a third conductive layer are advantageously applied for example to provide a second capacitor plate and the other necessary conductors for the electric circuit. The dielectric layer can be formed e.g. by silk screen printing or by another known method. Third conductive layer can also be formed e.g. by silk screen printing in which e.g. silver paste is used for forming the conductors. However, this dielectric layer and the third metallization layer are not shown in the appended FIGS. 3a–3f. Nevertheless, it is obvious that this third conductive layer can also be provided with one or more fuses by the above-mentioned method according to an advantageous embodiment of the invention. After the product sensor 2 has been provided with all the necessary layers, the product sensor 2 can still be, if necessary, laminated or coated in another way to be better resistant to ambient conditions.

At this stage, the surface of the substrate 1 of the product sensor 2 is provided with an electric circuit which, for example in anti-theft applications, comprises an RLC circuit. The coil L is a planar wire loop, and the capacitor C consists of two or more substantially planar plates, which is known as such.

The product sensor 2 can also have other properties known per se, such as layers known from product and information labels: a printable surface material, a transparent surface film, an adhesive, as well as a back paper. The product sensor 2 can also be punched out. Such a punched product sensor provided with an adhesive can be attached to a product or a product package or placed underneath a product label primarily by various automatic application or insertion devices already at the stage of manufacture, packaging or labelling. It is thus possible to achieve considerable savings in costs when compared with a situation in which the product sensors are placed in the products primarily manually, for example upon displaying products in stores or during storage.

In a manufacturing method according to another advantageous embodiment of the invention, the fuse F is preferably formed in the following way. The coil L and the capacitor C are formed in a way known as such, for example by etching, so that the conductor is broken at the location where the fuse is to be made. After this, an evaporation mask is pressed on the surface of the product sensor except at the point where the fuse is to be evaporated. After this, the fuse is evaporated e.g. with copper or aluminium. The product sensor 2 can then be provided with the other necessary layers, wherein the product sensor 2 comprises the desired electric couplings and can be coated, if necessary.

By forming the fuse by evaporating according to the present invention, the substrate 1 can be coated with a very small quantity of metal. A typical example to be mentioned of the dimensions of the fuse is about 50 $\mu$m×50 $\mu$m×0.2 $\mu$m, but it is obvious that also other fuse sizes can be used within the scope of the present invention. The manufacture of such a very small fuse in another way is very difficult with sufficiently strict production tolerances. However, a fuse made by evaporating according to the invention can be made with higher precision. Thus, also its resistance loading on the electric circuit remains smaller than for example in a fuse printed with a conductive paste, which improves the quality value of the circuit. Furthermore, the quantity of the evaporated metal is well controlled, and the material is very homogeneous, wherein its melting properties, such as specific heat capacity and specific melting temperature, can be well predicted. Furthermore, it can be stated that in the evaporating techniques, the material to be coated is coated in the molten state, wherein the interfaces formed by them with the metal surfaces to be evaporated are very close to ideal metal bonds, thereby not forming significant contact resistances. Moreover, the evaporated material is solid and non-crystalline, wherein its flexibility properties are also very good; thus, the strength of the product sensor 2 is very good for example upon bending of the product sensor 2.

Upon applying the above-mentioned manufacturing method, the fuse mask 5 is formed already at a very early stage of the manufacture and by very precise methods, such as gravure printing, before other processing, such as the transfer of the substrate from one roll to another. At such stages of handling of the substrate, extension can take place, but as the product sensor 2 is already formed before the further steps, these extensions do not substantially affect the properties of the product sensor. Moreover, the accuracy of positioning of the fuse is significantly better when using the method of the invention than solutions of prior art. Moreover, the method of manufacturing according to the invention also brings savings on costs, because it is possible by the evaporation to simultaneously provide both the fuse and the conductive substrate for the electrolysis. Thus, it is also possible to utilize copper electrolysis in the manufacture of the product sensor, wherein by the method of manufacturing according to the invention, it is possible to produce a product sensor 2 having a better coil conductivity value than with aluminium etching. In such a product sensor circuit comprising a fuse and being made with copper conductors, the Q value is substantially in the same order as in aluminium product sensors which are deactivated by breakdown. Thus, very reliable deactivation is achieved in the product sensor 2 according to the invention.

As already mentioned above in this description, the invention can also be applied in connection with product sensors used for e.g. identification. In this case, a fuse is not necessarily required in the product sensor 2, wherein the operations related to the fuse mask are not needed in the method of manufacturing according to the advantageous embodiment of the invention. In this advantageous embodiment, at least the coil conductors are thus implemented by evaporating a first conductive layer 3, adding an electrolytic resist 4, depositing a second conductive layer 6, and removing the electrolytic resist 4 and the part of the first conductive layer 3 that is substantially under the electrolytic resist. After this, it is possible to add, e.g. by wire ponding, an integrated circuit that is possibly required for storing identification data therein and for reading data from the same. Also the other layers can be added in further processing steps. This arrangement has e.g. the advantage that the wirings can be made with higher precision and, on the other hand, that the application of an expensive paste is avoided, without substantially impairing the electrical properties of the ready electric circuit.

It is obvious that the present invention is not limited solely to the above-presented embodiments, but it can be modified within the scope of the appended claims.

What is claimed is:

1. A method for forming a product sensor which includes a fuse, which sensor is formed on a polymeric film substrate, the product sensor having at least one electric circuit comprising at least one capacitor, at least one coil in electrical circuit with the fuse, and at least part of the electric circuit which includes the fuse is formed by applying a first conductive layer on the product sensor by evaporation; at least at the location of the electric circuit, wherein the production of the product sensor comprises:

depositing by evaporation a first conductive layer on at least one surface of the polymeric film substrate;

applying an etching resist on the first conductive layer at locations of portions of the electric circuit;

applying a fuse mask on the first conductive layer at the location of one or more fuses to be made in the product sensor;

etching parts of the first conductive layer which are not under the etching resist and the fuse mask to provide a fuse to remove the parts of the first conductive layer not under the etching resist and the fuse mask;

removing the etching resist; and depositing a second conductive layer on parts of the first conductive layer which remain after the etching process.

2. The method according to claim 1, wherein the method further comprises:

a first plating step, wherein parts of the electric circuit are formed, except for the fuse;

a step of forming an evaporation mask, wherein an evaporation mask is applied onto the first conductive layer, except for the location of one or more fuses to be provided in the product sensor; and an evaporation step, in which a first conductive layer is evaporated on those parts of the first conductive layer which do not contain an evaporation mask.

3. The method of claim 1 or 2 wherein the first conductive layer is selected from the group consisting of aluminum and copper.

4. The method of claim 3, wherein the first conductive layer is aluminum.

5. The method of claim 3 wherein the first conductive layer is copper.

6. A method for forming a product sensor which includes a fuse, which sensor is formed on a polymeric film substrate, the product sensor having at least one electric circuit comprising at least one capacitor, at least one coil in electrical circuit with the fuse, and at least part of the electric circuit which includes the fuse is formed by applying a first conductive layer on the product sensor by evaporation, at least at the location of the electric circuit, wherein the production of the product sensor comprises:

depositing by evaporation a first conductive layer on at least one surface of the polymeric film substrate;

applying an electrolytic resist on the first conductive layer at substantially other parts than at the electric circuit;

applying a fuse mask on the first conductive layer at the location of one or more fuses to be made in the product sensor;

a depositing a second conductive layer on parts of the first conductive layer which do not contain electrolytic resist or a fuse mask;

removing the electrolytic resist from the first conductive layer; and removing parts of the first conductive layer which is are not under the second conductive layer and the fuse mask to provide a fuse.

7. The method according to claim 6, wherein the method further comprises:

a first plating step, wherein parts of the electric circuit are formed, except for the fuse;

a step of forming an evaporation mask, wherein an evaporation mask is applied onto the first conductive layer, except for the location of one or more fuses to be provided in the product sensor; and an evaporation step, in which a first conductive layer is evaporated on those parts of the first conductive layer which do not contain an evaporation mask.

8. The method of claim 6 or 7 wherein the first conductive layer is selected from the group consisting of aluminum and copper.

9. The method of claim 8, wherein the first conductive layer is aluminum.

10. The method of claim 8, wherein the first conductive layer is copper.

* * * * *